(12) United States Patent
Takatz et al.

(10) Patent No.: US 7,483,500 B2
(45) Date of Patent: *Jan. 27, 2009

(54) NARROWBAND GAIN CONTROL OF RECEIVER WITH DIGITAL POST FILTERING

(75) Inventors: Mark J. Takatz, Melbourne, FL (US); Alton S. Keel, Jr., Hellam, PA (US); Stefan Haenggi, Melbourne Beach, FL (US)

(73) Assignee: IPR Licensing, Inc., Wilmington, DE (US)

( * ) Notice: Subject to any disclaimer, the term of this patent is extended or adjusted under 35 U.S.C. 154(b) by 41 days.

This patent is subject to a terminal disclaimer.

(21) Appl. No.: 11/399,224

(22) Filed: Apr. 6, 2006

(65) Prior Publication Data

US 2006/0188042 A1 Aug. 24, 2006

Related U.S. Application Data

(63) Continuation of application No. 09/847,056, filed on May 1, 2001, now Pat. No. 7,046,749.

(51) Int. Cl.
*H04L 27/08* (2006.01)
(52) U.S. Cl. .................. 375/345; 375/316; 455/136; 455/138; 455/234.1; 455/239.1; 455/245.1; 455/247.1
(58) Field of Classification Search ............... 375/316, 375/345; 455/136, 138, 239.1, 245.1, 247.1, 455/234.1
See application file for complete search history.

(56) References Cited

U.S. PATENT DOCUMENTS 5,175,883 A 12/1992 Ueno 5,469,115 A 11/1995 Peterzell et al.
5,640,385 A 6/1997 Long et al.

(Continued)

FOREIGN PATENT DOCUMENTS

WO WO 96/10298 4/1996

(Continued)

*Primary Examiner*—Ted M. Wang
(74) *Attorney, Agent, or Firm*—Volpe and Koenig, P.C.

(57) ABSTRACT

An Automatic Gain Control (AGC) circuit as used in a digital receiver that utilizes a main loop filter that is of a relatively wide bandwidth. A pre-filter, wideband variance is determined from the input digital signal, and a post-filter, narrowband variance is also determined. The wideband and narrowband variances are then compared to determine if the wideband signal power indicates a variance level that is too great to permit normal loop operation. By reapplying this difference in the power levels to the filter output as needed, such as by a scaling operation, the loss in dynamic range is effectively recovered. In a preferred embodiment, an adjustable gain input amplifier feeds an intermediate frequency (IF) signal to an analog-to-digital converter (ADC). The digitized IF signal is then down-converted to a baseband frequency and subjected to digital filtering. A narrowband sample variance ($P_N$) of the digitally filtered (narrowband) data is then determined. A wideband sample variance ($P_W$) is also taken from the raw ADC output data over the same period as the time period used for $P_N$. In the presence of out-of-band signal components, $P_W$ will be quite different from $P_N$. This difference indicates a desired proportional difference in a control voltage or a gain backoff amount.

10 Claims, 7 Drawing Sheets

U.S. PATENT DOCUMENTS

| | | |
|---|---|---|
| 6,178,211 B1 | 1/2001 | Whikehart et al. |
| 6,556,636 B1 | 4/2003 | Takagi |
| 6,650,878 B1 | 11/2003 | Abe et al. |
| 6,658,069 B1 | 12/2003 | Imura |
| 6,731,703 B2 | 5/2004 | Kurihara |

FOREIGN PATENT DOCUMENTS

| | | |
|---|---|---|
| WO | WO 00/18023 | 3/2000 |

NARROWBAND GAIN CONTROL OF RECEIVER WITH DIGITAL POST FILTERING

RELATED APPLICATIONS

This application is a continuation of U.S. application Ser. No. 09/847,056, filed May 1, 2001 now U.S. Pat. No. 7,046,749. The entire teachings of the above application is incorporated herein by reference.

BACKGROUND OF THE INVENTION

The present invention relates generally to radio receivers in which intermediate frequency signals are processed digitally, and more specifically to an automatic gain control circuit that compensates for added wideband signal power.

Modern radio receivers, such as used in cellular telephone, wireless Local Area Network (LAN), wireless Internet access systems, and similar equipment typically now employ digital signal processing techniques to some degree. Digital signal processing permits the replacement of physically large, costly, and unpredictable analog filtering components with their digital counterparts. These receiver architectures require high speed, wideband, analog-to-digital converts (ADCs) and digital filters. Present day ADC technology permits sampling at Intermediate Frequency (IF) or even greater frequencies. However, by replacing traditional analog filters with digital filters implemented after digitization, the ADC potentially also samples out-of-band unwanted signal components. These unwanted signal components may consist of adjacent channels, extra noise, or even jamming signals along with the desired signal of interest.

Direct application of analog receiver architectures to a digital implementation therefore, is often not sufficient to provide the required signal filtering properties. One difficulty stems from the fact that analog demodulation techniques are not directly adaptable to digital receivers. For example, clipping of a received signal lowers the probability of correctly detecting the signal of interest and the data derived there from.

To reduce clipping, digital receivers often include one or more variable gain amplifiers that permit the gain of the receiver to be adjusted by a feedback control signal. The process of adjusting the received signal in this fashion is called Automatic Gain Control (AGC). In the typical digital receiver, the AGC circuitry measures an output signal power of the variable gain amplifier. This measured value is then compared with a value representing the desired signal power to derive an error signal. The error signal is then used to control the variable amplifier gain so that the input signal strength coincides with the desired input signal power. In the typical desired arrangement, the AGC circuit therefore may hold the amplitude of the variable gain amplitude close to the full dynamic range of the analog-to-digital converter.

In the presence of out-of-band signal components, standard gain control loop architectures are often insufficient to guarantee proper analog-to-digital converter operation. Especially in the cellular environment, a digital receiver may receive signals that exhibit rapid and wide variation in signal power. For example, in Code Division Multiple Access (CDMA) wireless communications, it is necessary to precisely control the power level of transmitted signals for proper capacity management.

Some have proposed the use of an AGC circuit wherein the filter bandwidth may be changed. In particular, as described in U.S. Pat. No. 6,178,211, the filter coefficients of a digital signal processor are switchable between a first wide bandwidth to a second narrower bandwidth. A post-filter level detector is responsive to the filtered signal and provides a control signal for selecting one of the banks of filter coefficients. Thus, the circuit reduces the effect of adjacent channel interference by narrowing the bandwidth of a filter in the receiver, which reduces the signal content from the adjacent channel propagating through the receiver.

This type of circuit provides an effective method of filtering out of band signals after the ADC. However, gain control in this circuit is based entirely on the signal power present at the input to the ADC, rather, its digital output. This requires an adaptive filtering technique to switch to the proper coefficients as needed. Often, cases arise in which multiple sets of filter coefficients are not available due to signal processing or memory resource restrictions.

SUMMARY OF THE INVENTION

The circuit proposed herein benefits from reduced complexity by using a fixed set of filter coefficients and switching control of the AGC loop from narrowband to wideband power calculations (and the reverse) as necessary. Furthermore, backend gain control is achieved with a simple scale multiplier applied to both the in-phase (I) and quadrature (Q) data paths.

More particularly, the present invention is an architecture for an Automatic Gain Control (AGC) circuit as used in a digital receiver that utilizes a main loop filter that is of a relatively wide bandwidth. A pre-filter, wideband variance is determined from the input digital signal. In addition, a post-filter, narrowband variance is also determined. The wideband and narrowband variances are then compared to determine if the wideband signal power indicates a variance level that is too great to permit normal loop operation. In such a case, the dynamic range of the desired signal components (e.g., the desired narrowband signal) would otherwise be reduced. By reapplying this difference in the power levels to the filter output, such as by a scaling operation, the loss in dynamic range is effectively recovered.

In a preferred embodiment, an Automatic Gain Control (AGC) circuit includes an additional wideband and narrowband variance comparison section. An adjustable gain input amplifier feeds an intermediate frequency (IF) signal to an analog-to-digital converter (ADC). The digitized IF signal is then down-converted to a baseband frequency and subjected to digital filtering. A narrowband sample variance (PN) of the digitally filtered (narrowband) data is then determined. A wideband sample variance (PW) is also taken from the raw ADC output data over the same period as the time period used for PN.

Assuming that the input signal fed to the ADC is relatively band limited, under normal operating conditions without much interference signal level, the digitally post-filtered signal level has relatively the same power as the raw ADC output. In other words, the normal condition is such that the digital filter removes only perhaps low-level noise and aliasing components generated from the down-conversion process.

In the presence of out-of-band signal components, the wideband sample variance (PW) will be quite different from the narrowband sample variance (PN). This difference indicates a desired proportional difference in a control voltage or a gain backoff amount. Once this backoff amount exceeds a predetermined level, that value is used in a control voltage calculation to reduce input signal.

However, simply replacing the narrowband variance with the wideband variance in the control voltage calculation may yield an inaccurate received signal strength indication and, in turn, actually reduce the signal level of the filtered data. Thus, this power level backoff voltage is also converted to a scale value used to multiply or amplify the filtered data.

This results in recovering the reduced signal level of the filtered data. In addition, if the sampling or decimation rate is high enough, lost sample resolution can also be recovered by output filtering.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of preferred embodiments of the invention follows.

While this invention has been particularly shown and described with references to preferred embodiments thereof, it will be understood by those skilled in the art that various changes in form and details may be made therein without departing from the scope of the invention encompassed by the appended claims.

Figure 1:
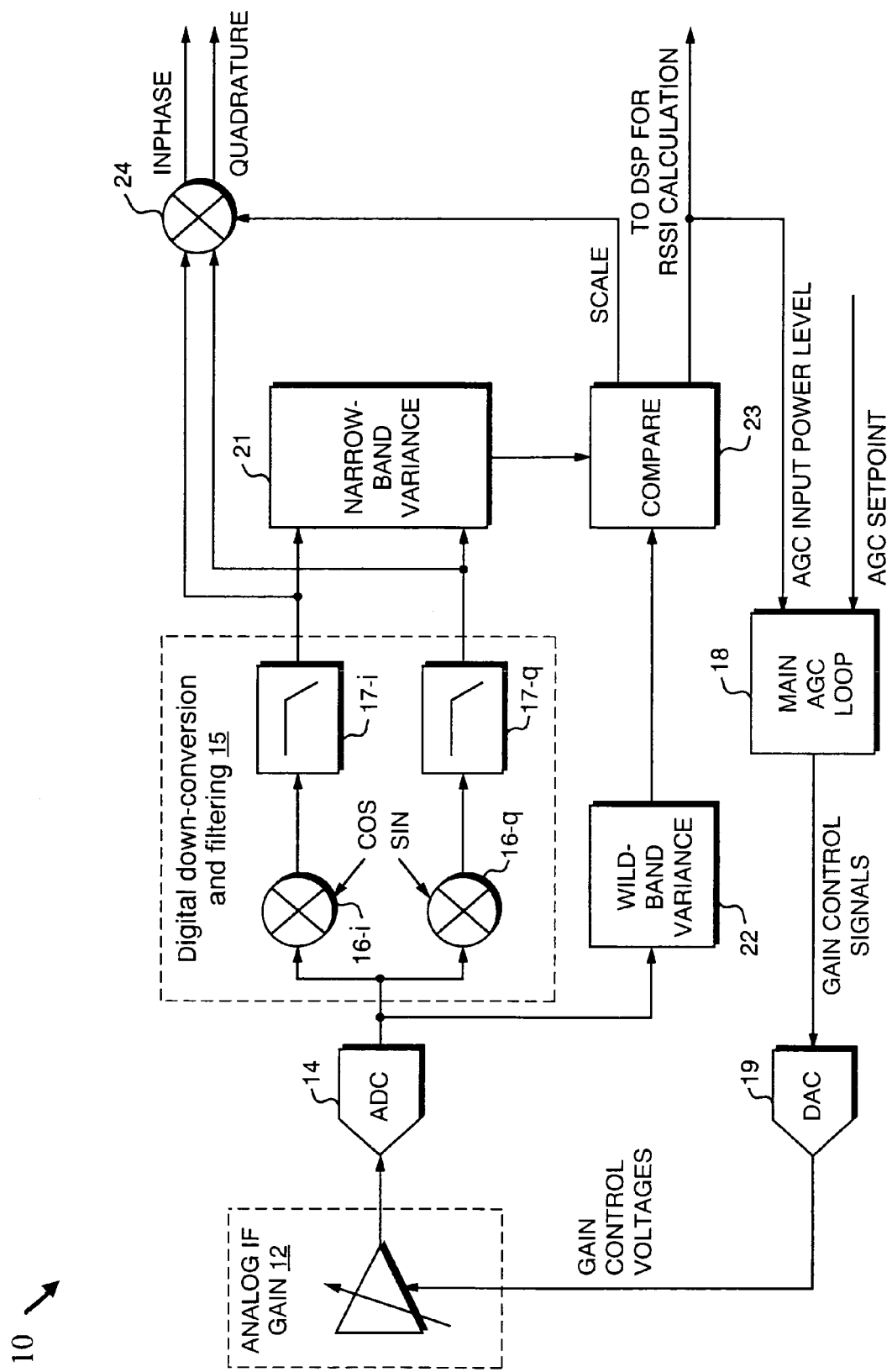
FIG. 1 is a high-level block diagram of an automatic gain control circuit that makes use of a wideband and narrowband variance determination according to the invention.

Turning attention now to FIG. 1, there is shown a high-level block diagram of an Automatic Gain Control (AGC) circuit 10 operated in accordance with the invention. The AGC circuit 10 includes a variable gain input intermediate frequency (IF) amplifier 12, an analog-to-digital converter (ADC) 14, digital down-converter and filter block 15 that includes quadrature mixers 16-*i* and 16-*q* as well as a pair of low pass filters 17-*i* and 17-*q*, associated with an in-phase quadrature signal path, a main AGC loop filter 18, and digital-to-analog converter (DAC) 19. The variable gain amplifier 12, ADC 14, digital down-converter and filter 15, main ACG loop filter 18, and DAC 19 are standard components of a digitally implemented Automatic Gain Control circuit.

A unique aspect of the present invention is to also include a wideband variance block 22 coupled to the output of the ADC 14, a narrowband variance block 21 coupled to the output of the digital down-converter and filter 15, a comparison function 23 to compare the output of wideband variance 22 and narrowband variance 21, as well as output scaler 24. In general, the components that comprise the invention add a variance comparison section that determines the difference between a narrowband sample variance as represented by the signal samples at the output of the filters 17, and comparing that to a wideband sample variance associated with the input to the digital down-converter and filter 15.

The difference between the wideband sample variance (PW) as provided by the wideband variance circuit 22 and narrowband variance value (PN) as provided by the narrowband variance circuit 21 represents an indication of whether the setting of the gain control loop is sufficient to guarantee proper operation of the ADC 14. In particular, when the difference between the wideband sample variance PW and the narrowband sample variance PN exceeds a predetermined level, an input power level voltage is provided to the main AGC loop 18 to cause it to limit clipping by the ADC 14.

Thus, in cases when the narrowband sample variance PN of the narrowband data is sufficiently the same as the determined wideband variance PW, then the loop operates as in the prior art as a standard automatic gain control loop. However, when the power level of out-of-band signal components is sufficiently large (as provided by jamming signals, noise, interfering adjacent channels, etc.), the difference in variance is detected at the output of the comparison 23. In this instance, an additional input power level voltage is provided to offset the AGC loop setpoint input.

A scale value is also preferably provided at the output of the comparison 23. The scale value allows the multiplier 24 to offset a reduction in the power level of the filtered data during conditions when the wideband variance exceeds the narrowband variance. In systems with relatively high decimation rates, even the lost sample resolution can be recovered, provided adequate filtering is applied after the multiplication.

Figure 2:
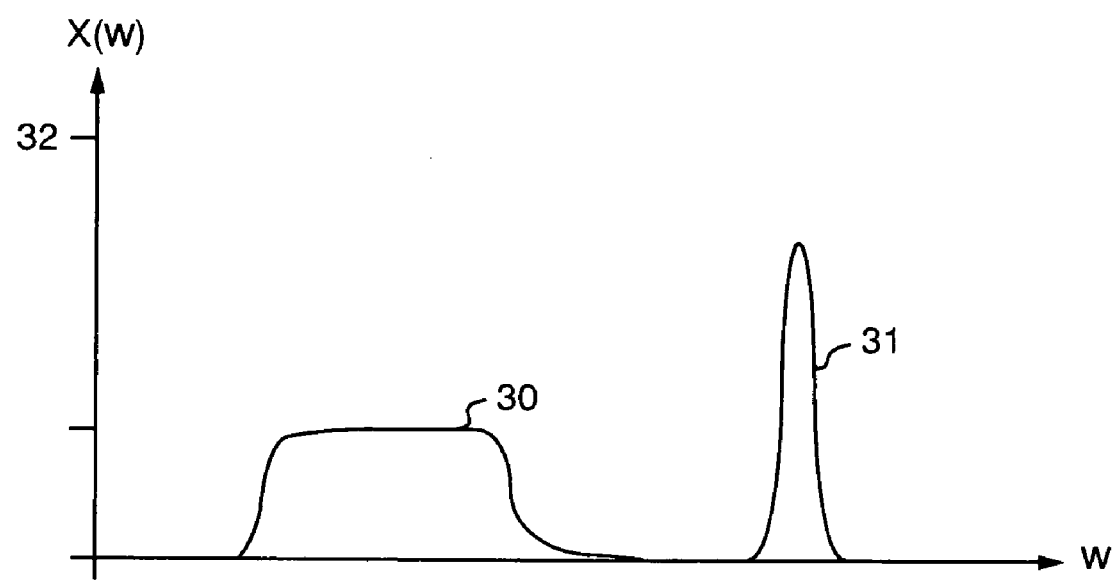
FIG. 2 illustrates a situation where narrowband interference reduces the available dynamic range at the input to the analog-to-digital converter.
Figure 3:
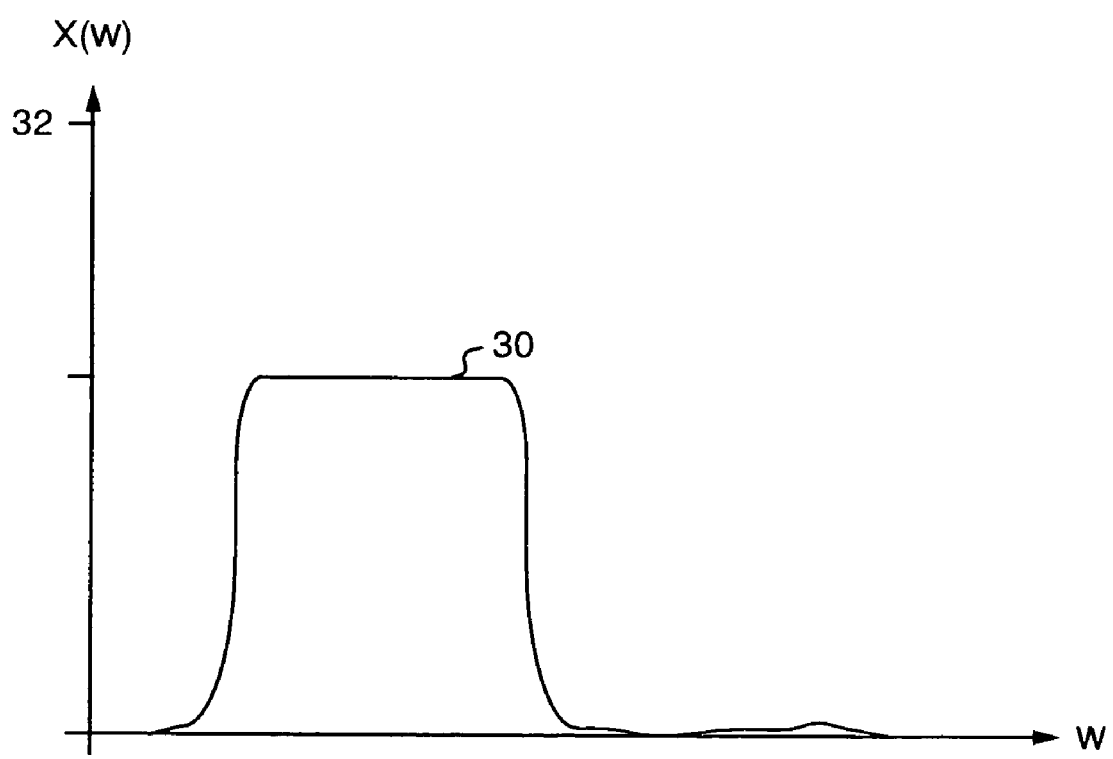
FIG. 3 illustrates the affect of the present invention on the available dynamic range.

Turning attention now to FIGS. 2 and 3, the situation addressed by the invention is described in relative terms. In particular, in connection with FIG. 2, there is shown a signal power diagram for signals present at the input of the ADC 14. In this instance, not only is a desired signal 30 present, but also there is present an out-of-band interfering signal 31. The ideal power level setpoint for the analog-to-digital converter should be at a level 32. However, the presence of the relatively strong interference 31, that is, a signal that is much stronger than the desired signal 30, causes a standard AGC loop to adjust itself to avoid clipping of the ADC 14 output. Thus, the desired signal 30 is suppressed in amplitude, causing reduced accuracy in RSSI calculation and the like.

FIG. 3 shows a program in a situation as provided by the invention. In particular, using a comparison between the narrowband variance and wideband variance, the loop gain control signals are adjusted accordingly such that the power of the desired signal is increased at the output of the ADC 14. This results in a more accurate magnitude of an output signal and results in overall improved receiver performance.

Figure 4:
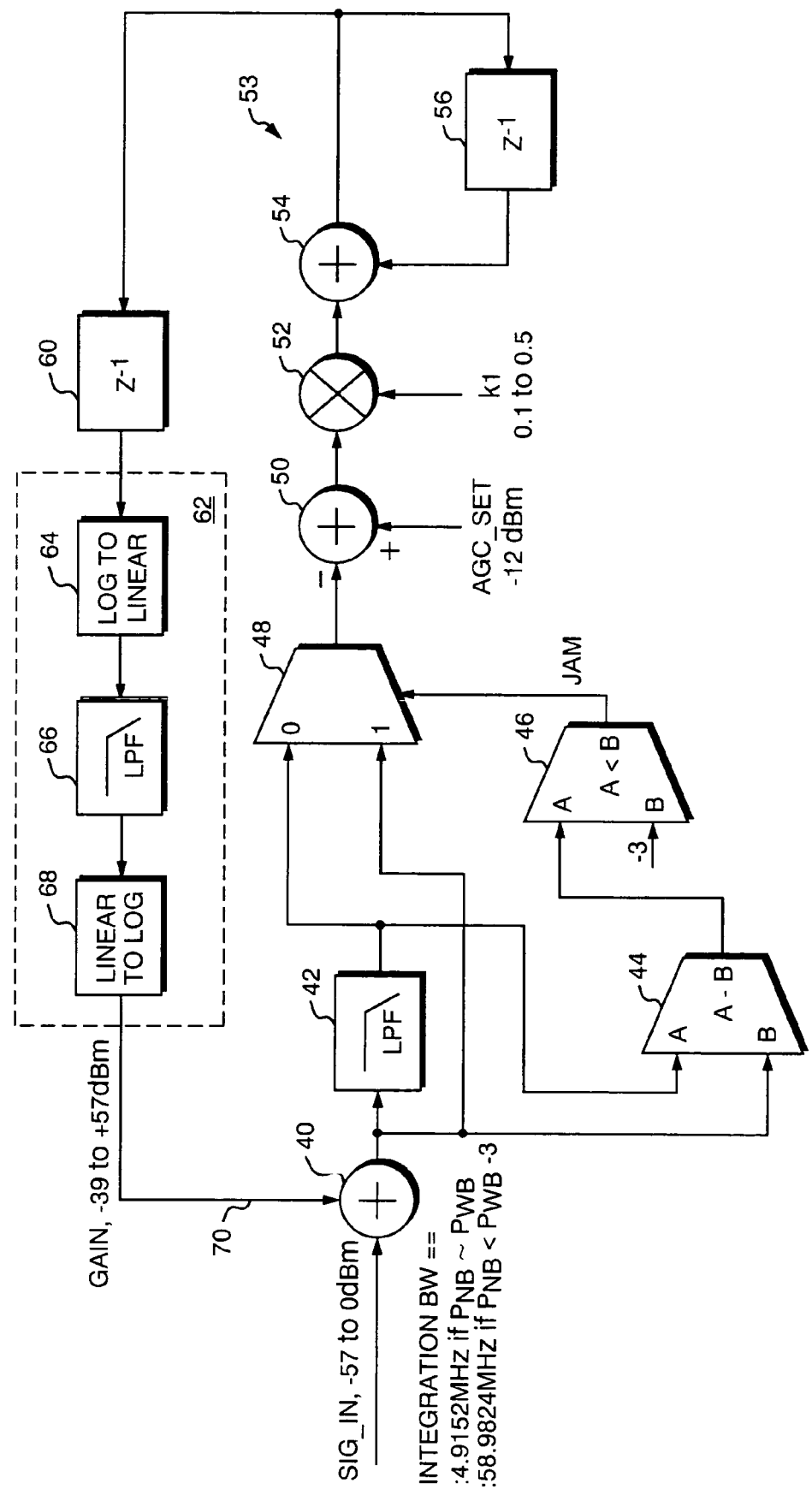
FIG. 4 is a signal flow diagram representation of the automatic gain control circuit.

FIG. 4 is a signal flow representation of the AGC circuit 10. In the preferred embodiment, an input signal scaled from a range of −57 through zero decibels with respect to a millivolt (dBm) is provided to an input adder 40. The adder 40 represents the operation of the variable gain amplifier that is controlled by the gain control input signal 70.

The amplifier output is fed to a lowpass filter 42. The difference circuit 44 provides an estimate of the difference between the input and output voltages applied to the lowpass filter 42. A comparator 46 then compares this difference to a predetermined threshold. In this instance, the predetermined threshold is set to −3 dBm or a half-power level. If the output signal power provided by the lowpass filter 42 is less than the input signal power, then the jamming signal (JAM) is asserted. In this instance, it is concluded that jamming or interfering signal power is present such that the power level that is between the in-band and out-of-band signals needs to be added back into the down-converter data. In this instance, the unfiltered input signal is selected by the multiplexer 48.

In an instance where the narrowband signal power is approximately the same or greater than the broadband signal power, then the filtered signal is used for the low control signal. An AGC setpoint is then compared by comparator 50 and the signal is scaled by the gain constant K1. A loop filter 53 represented by the summer and delay 56 filters this feedback signal. Additional delay may be provided by a delay block 60.

The digital analog converter (DAC) is represented by a model 52 that includes log-to-linear converter, lowpass filter 66, and linear-to-log converter 68.

The resulting signal is then fed as the gain control signal 70 back to the input. Decimation, although not shown in FIG. 4, can be provided so that any values larger than a predetermined value merely serve to scale the data while maintaining the same relative resolution.

Figure 5A:
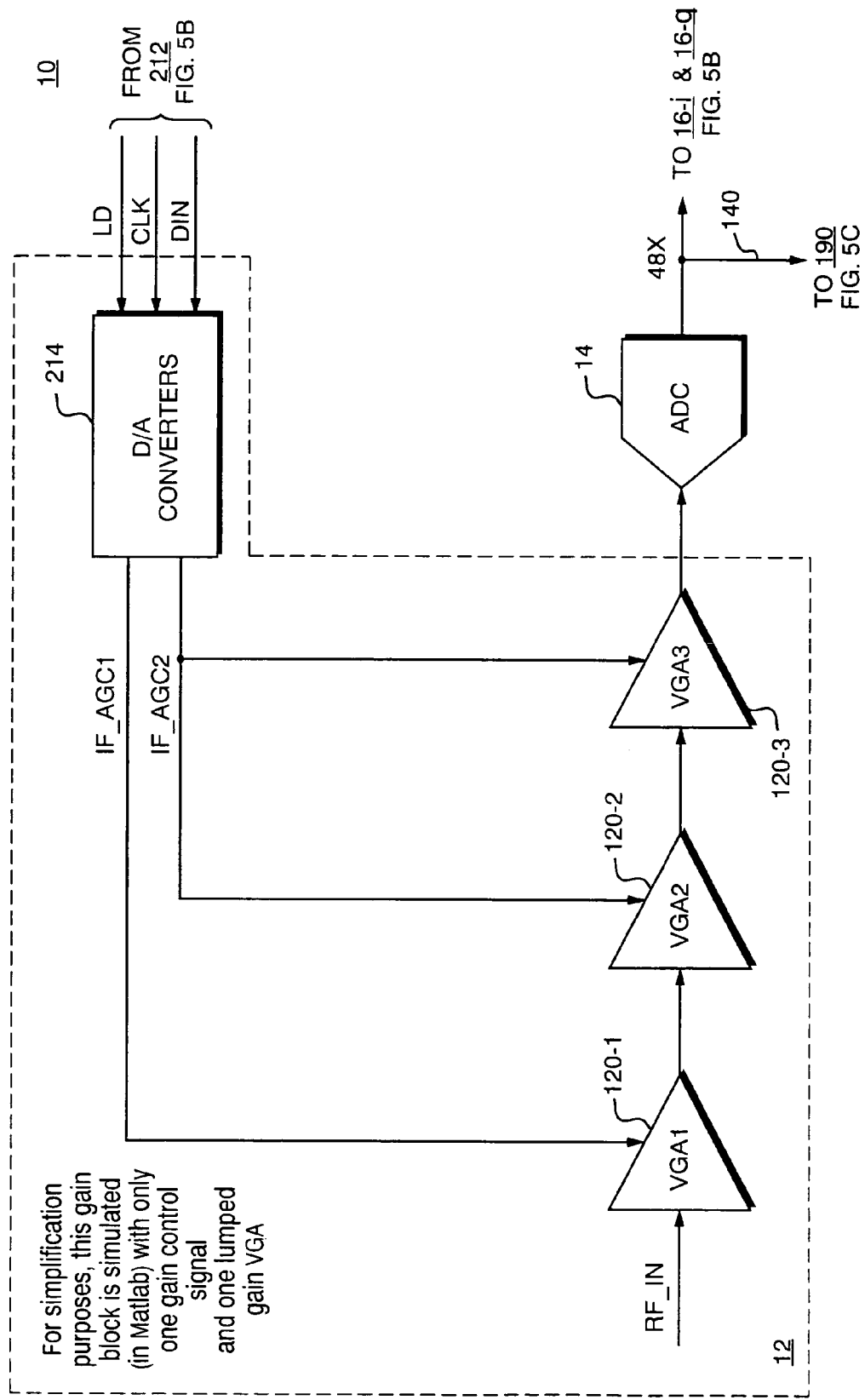
FIGS. 5A, 5B, and 5C are a detailed circuit diagram of the automatic gain control circuit.
Figure 5B:
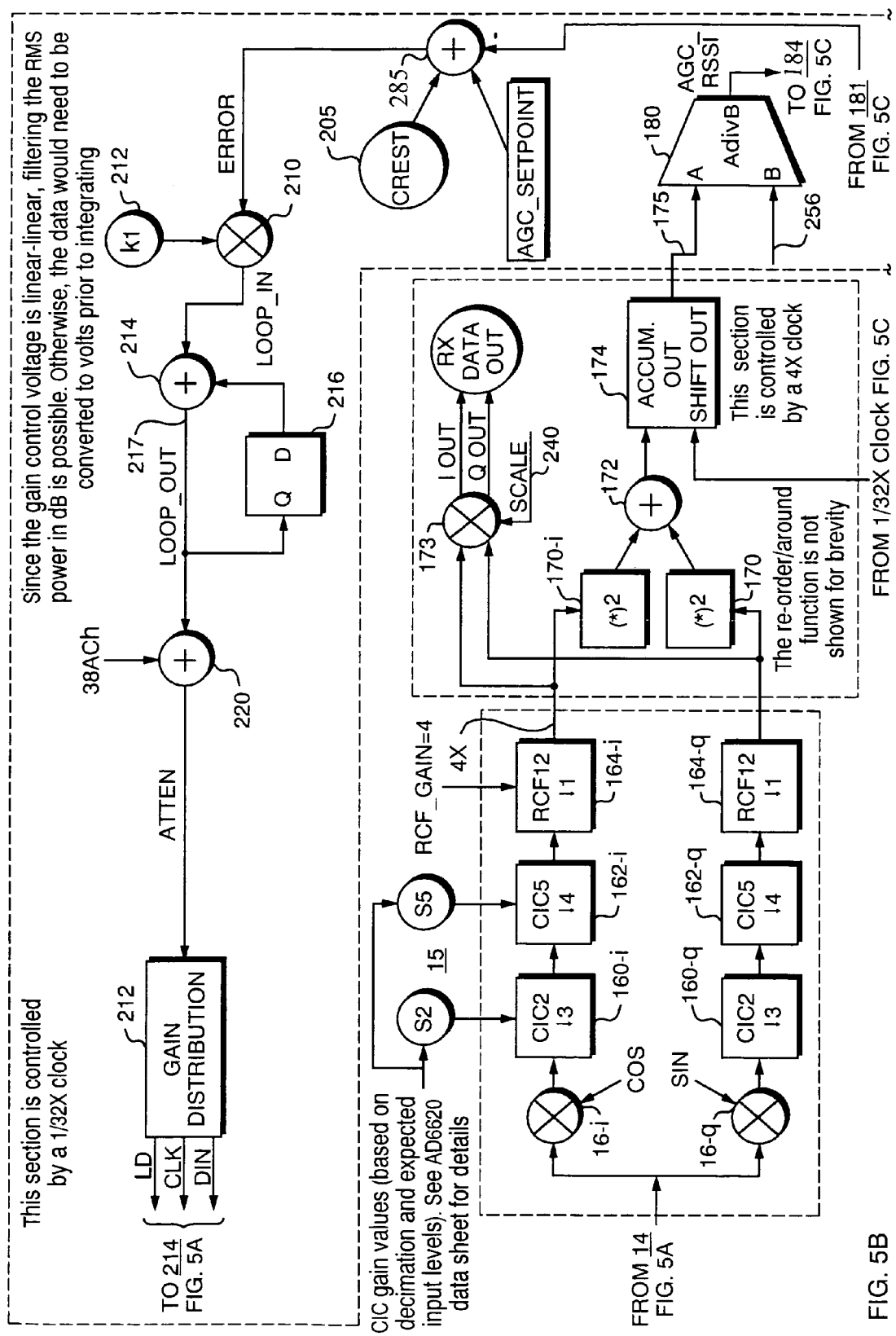
Figure 5C:
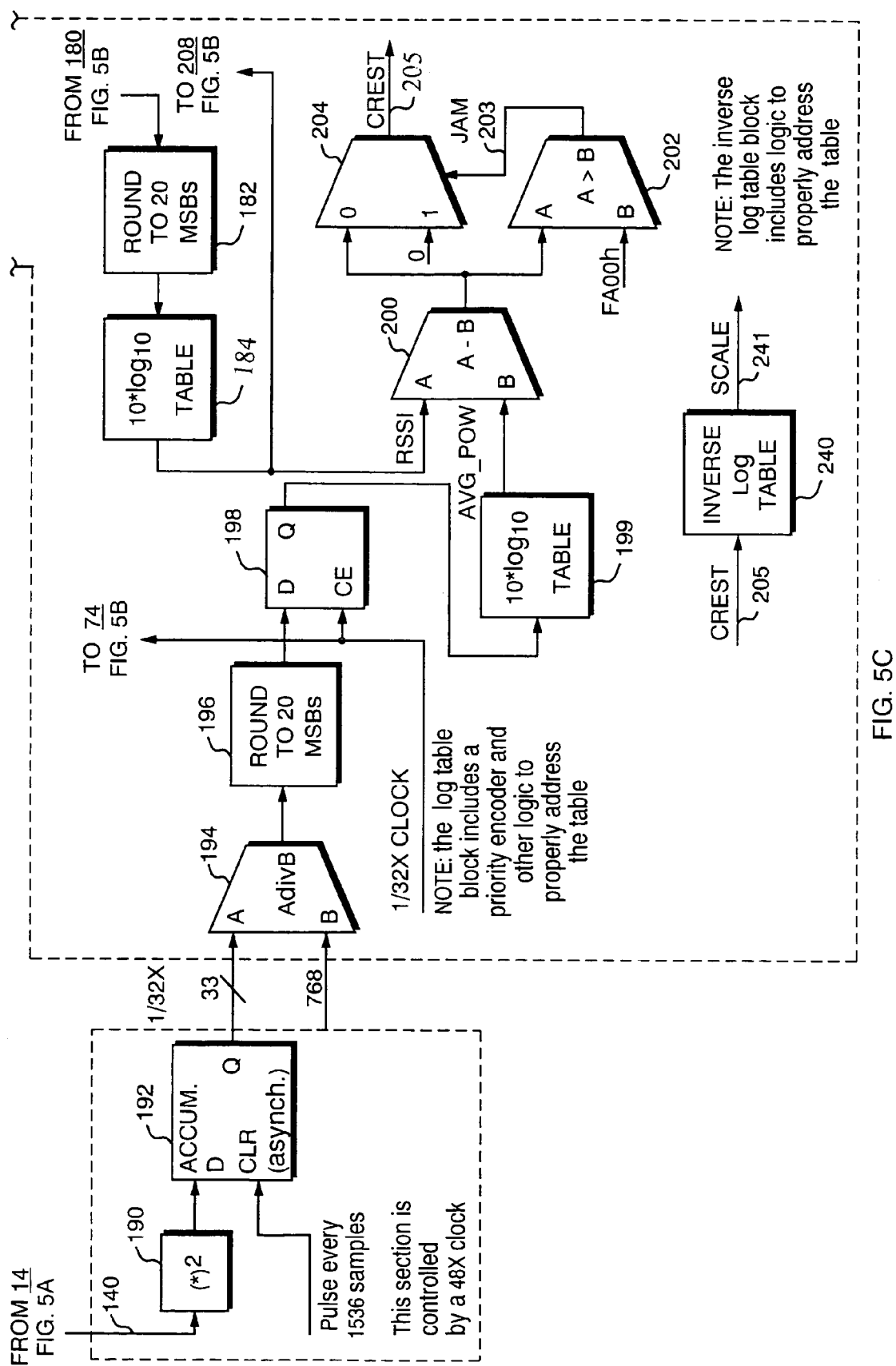

FIGS. 5A, 5B, and 5C are a detailed circuit diagram for one preferred embodiment of the AGC circuit 10. In this implementation, the variable gain amplifier 12 is seen to comprise three individual variable gain stages 120-1, 120-2, and 120-3.

The analog-to-digital converter (ADC) 14 is a 12-bit converter operating at 58.9824 mega-samples per second (Msps), provided with a 2-volt peak-to-peak input signal on a 70 MHz IF frequency. The sample rate of 58.9824 Msps represents a rate of 48 times the known bandwidth of an input signal that is 1.2288 MHz, which is typical for an input CDMA radio frequency signal.

The digital down conversion and filtering circuit 15 is implemented in an integrated circuit known as an AD6620 available from Analog Devices of Wilmington, Mass. The device provides a 16-bit signal path for both in-phase (I) and quadrature (Q) signal processing. The sampling rate is set at 4.9152 mega samples per second at baseband and an AGC update rate of 38.4 kilohertz. The AD6620 includes the input quadrature mixer 16-$i$, 16-$q$, two cascaded integrator comb (CIC) type filters, and a Ram Coefficient Filter (RCF).

Figure 6:
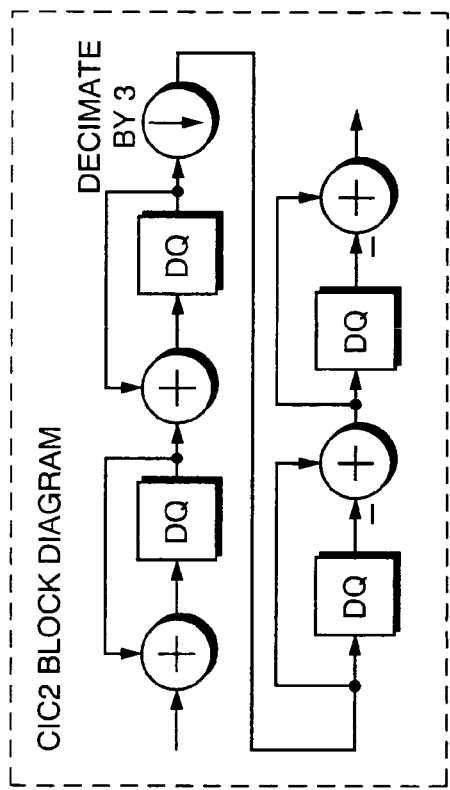
FIG. 6 is a more detailed view of the two-stage digital filter block.
Figure 7:
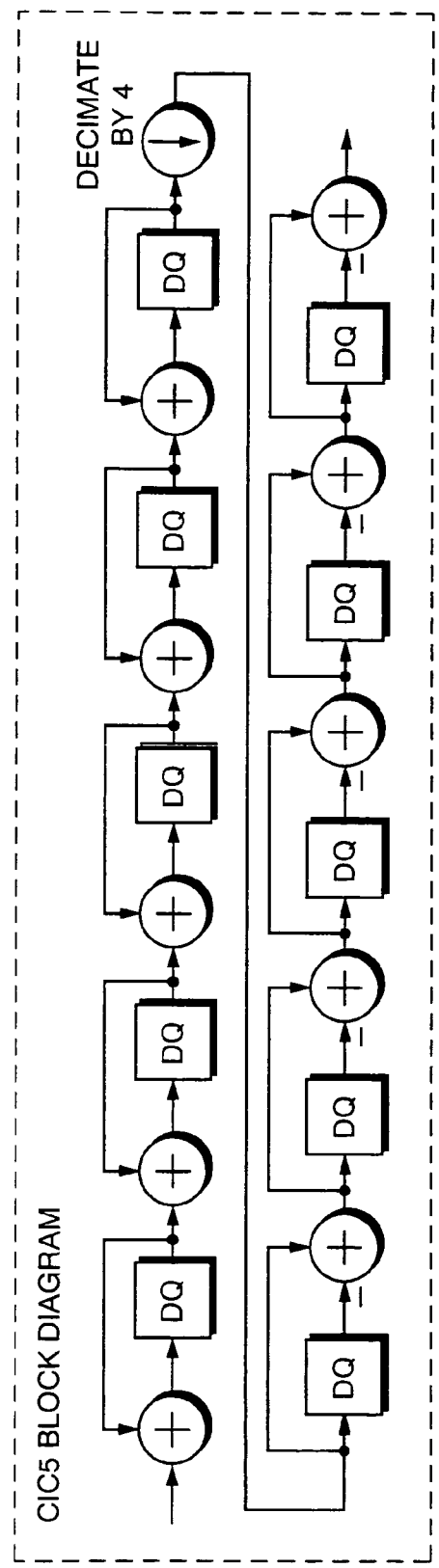
FIG. 7 is a more detailed view of the five-stage digital filter block.

FIG. 6 is a more detailed diagram of a two-stage CIC filter shown as elements 160-$i$-1 and 160-$q$-1. This filter provides decimation by a factor of three. For the preferred implementation, the filter has an equivalent Finite Impulse Response (FIR) as follows:

$H2=[1, 2, 3, 2, 1]/16$

The five-stage CIC5 filter designated as 162-$i$-1 and 162-$q$-1 has a similar FIR-type response. This filter, however has five stages with a response as follows:

$H5=[1, 5, 15, 35, 65, 101, 135, 155, 155, 135, 101,$
$65, 35, 15, 5, 1]/1024$

The cascaded CIC filters 160 and 162 provide a total factor-of-12 decimation, resulting in a four times rate output (4.9152 Msps).

The RCF filter 164-$i$ and 164-$q$ is a 12-tap FIR filter with coefficients:

$H12=[12512, -10490, -34369, -1668, 99965,$
$195803, 195803, 99965, -1668, -34369,$
$-10490, 12512]/524288$

An estimate of narrowband variance provided by the power level determination circuit is implemented with the squarers 170-$i$, 170-$q$, and summer 172, as well as accumulator 174. The accumulator 174 provides an average output power indication for every 128 samples, with the shift-out operation being controlled by a 1/32 times clock. The average power value output on signal line 175 is then fed to the differencing circuit 180. The narrowband variance value is determined from components of the received RF signal across a bandwidth which is less than twice a bandwidth of the intended received signal.

A wideband variance estimate is provided by taking the signal 140 output from the ADC and feeding it to a squaring circuit 190. As in the case with squaring circuits 170-$i$ and 170-$q$, the squaring circuit 190 results in an output signal at twice the frequency of the input RF signal. The wide band variance value is determined from components of the received RF signal across a bandwidth which is at least twice as wide as a bandwidth of the intended receiver signal. The output of squaring circuit 190 is then fed to an accumulator 192 that provides a sample output every 1/32 clock period time. The accumulated power value is then fed to a divider 194 and rounding 196 to provide an average value for the wideband variance estimate. This value is then fed to the flip-flop 198 to align it in time with the narrowband value.

Returning attention to generation of the narrowband variance value, the differencing circuit feeds a rounding circuit 182 and log table 184 prior to being fed as the Received Signal Strength Indication (RSSI) value to the input of an A minus B comparator 200. The A minus B comparator 200 accepts the output of the log table 199 containing the average wideband power value at input B.

The differencing circuit 200 thus provides the narrowband minus wideband estimate that is needed to determine the value of the scale factor and other control factors on the loop. For example, the comparator 202 compares the output of differencing circuit 200 to a (arbitrary) value 0xFA00 that is a 16-bit hexadecimal representation of a −3 dB reference value multiplied by 512. This comparator 202 thus indicates whether the wideband value is greater than the threshold value, and if so, asserting the JAM signal 203 to control the multiplexer 204 output to create the crest signal 205.

Thus, if the narrowband variance signal is greater in magnitude than the wideband variance signal, then the narrowband signal is used to control the remainder of the loop. Otherwise, the signal is zeroed out and not permitted to control the crest of the loop operation.

The crest signal 205 is then fed about to the AGC setpoint summer 208 that is, in turn, fed to the loop filter. The loop filter in this embodiment consists of the multiplier 210, gain input 212, summer 214 and delay 216. The loop output signal 217 is then ingested by an attenuation factor to provide attitude 220 to provide an attenuated output signal. This is then fed to a gain distribution circuit 212 that provides various signals to control the operation of the D to A converters (DACs) 214. The DACs 214 provide signals IF_AGC1 and IF_AGC2 to control the respective variable gain amplifiers 120-1, 120-2, and 120-3.

Since the gain control voltage in the loop filter is linear-linear, filtering the RMS power level in decibels is possible. Otherwise, if alternate formats are used, the data needs to be converted to volts prior to the integration process performed by the local filter components 214 and 216.

A crest value 205 is also fed to an inverse log table 240 to provide the scale factor 241. The scale factor is then used as an input to the multiplier 173 that provides the visual received data output on both I and Q channels.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for automatic gain control in a circuit that outputs a digitized signal, comprising:
coupling an input signal to a variable gain amplifier, the variable gain amplifier producing a gain controlled signal in accordance with a gain control input;
digitizing the gain controlled signal to produce a digital signal;
determining a wideband variance value from the digital signal;
determining a narrowband variance value from the digital signal; and
comparing the wideband variance value and narrowband variance value, to set a reference level for the automatic gain control loop circuit and determined a scale factor for the input to the variable gain amplifier, wherein the narrowband variance value is connected to set the gain control input on the gain controller receiver.

2. The method of claim 1, additionally comprising the step of:
filtering the digital signal to produce a filtered signal;
determining the narrowband variance value from the filtered signal.

3. The method of claim 2, wherein the signal is a baseband signal.

4. The method of claim 2, additionally comprising the step of:
down-converting the digital signal, to produce a down-converted signal; quadrature demodulating the down-converted signal, to produce an in-phase (I) and quadrature (Q) signal used in determining the narrowband variance value.

5. The method of claim 1, wherein the wideband variance value is determined directly from the input signal.

6. An automatic gain control apparatus for use in a radio frequency receiver that outputs a down-converted, digitized signal, the apparatus comprising:
a variable gain amplifier coupled to receive a radio frequency (RF) signal, the variable gain receiver amplifier having a gain control input, and to produce a gain controlled RF signal;
a digitizer, connected to digitize the gain controlled RF signal to produce a received digital signal;
a wideband variance detector, for determining a wideband variance value from the received digital signal;
a narrowband variance detector, for determining a narrowband variance value from the received digital signal; and
a comparator, for comparing the wideband variance value and narrowband variance value, to set a reference level for the automatic gain control loop circuit, wherein the narrowband variance value is connected to set the gain control input on the gain controlled receiver.

7. An apparatus as in claim 6 wherein the wideband variance value is determined directly from the received digital signal.

8. An apparatus as in claim 6 additionally comprising:
a down-converter, for down-converting the received digital signal, to produce a down-converted signal;
a filter, connected to receive the down-converted signal, and to produce a filtered received signal; and
wherein the narrowband variance detector determines the narrowband variance value from the filtered received signal.

9. An apparatus as in claim 6 wherein the down-converted signal is a baseband signal.

10. An apparatus as in claim 6 additionally comprising:
a quadrature demodulator, connected to receive the down-converted signal, and to produce an in-phase (I) and quadrature (Q) signal used in determining the narrowband variance value.

* * * * *

UNITED STATES PATENT AND TRADEMARK OFFICE
CERTIFICATE OF CORRECTION

PATENT NO. : 7,483,500 B2  Page 1 of 1
APPLICATION NO. : 11/399224
DATED : January 27, 2009
INVENTOR(S) : Takatz et al.

It is certified that error appears in the above-identified patent and that said Letters Patent is hereby corrected as shown below:

IN THE SPECIFICATION

At column 1, line 25, before "(ADCs)" delete "converts" and insert therefor --converters--.

At column 3, line 56, after the word "main" delete "ACG" and insert therefor --AGC--.

At column 5, line 11, before the word "converter" delete "digital analog" and insert therefor --digital-to-analog--.

At column 6, line 41, after the word "fed" delete "about".

At column 6, line 48, after the words "of the" delete "D to A" and insert therefor --D-to-A--.

IN THE CLAIMS

At claim 1, column 7, line 18, before the word "receiver" delete "controller" and insert therefor --controlled--.

At claim 6, column 8, line 14, before the word "wherein" insert --and determine a scale factor for the input to the variable gain amplifier,--.

Signed and Sealed this

Twenty-sixth Day of May, 2009

JOHN DOLL
*Acting Director of the United States Patent and Trademark Office*